(12) United States Patent
Larson

(10) Patent No.: US 11,496,073 B2
(45) Date of Patent: Nov. 8, 2022

(54) RECOVERING SMALL SCALE ENERGY IN ELECTRONIC SYSTEMS

(71) Applicant: Cupertino Electric, Inc., San Jose, CA (US)

(72) Inventor: Nathan Larson, Antioch, IL (US)

(73) Assignee: Cupertino Electric, Inc., San Jose, CA (US)

( * ) Notice: Subject to any disclaimer, the term of this patent is extended or adjusted under 35 U.S.C. 154(b) by 135 days.

(21) Appl. No.: 16/913,543

(22) Filed: Jun. 26, 2020

(65) Prior Publication Data

US 2020/0412279 A1    Dec. 31, 2020

Related U.S. Application Data

(60) Provisional application No. 62/868,593, filed on Jun. 28, 2019.

(51) Int. Cl.
| | |
|---|---|
| *G06F 1/3203* | (2019.01) |
| *H02N 11/00* | (2006.01) |
| *G06F 1/20* | (2006.01) |
| *H05K 7/20* | (2006.01) |
| *G06F 1/26* | (2006.01) |

(52) U.S. Cl.
CPC ............. *H02N 11/002* (2013.01); *G06F 1/20* (2013.01); *G06F 1/26* (2013.01); *H05K 7/20009* (2013.01); *H05K 7/20218* (2013.01); *G06F 2200/201* (2013.01)

(58) Field of Classification Search
CPC ...................................................... G06F 1/3203
USPC .......................................................... 713/300
See application file for complete search history.

(56) References Cited

U.S. PATENT DOCUMENTS

| | | | |
|---|---|---|---|
| 2006/0107987 A1* | 5/2006 | Chen ........................ | G06F 1/20 136/205 |
| 2007/0007771 A1* | 1/2007 | Biddle ...................... | F02G 5/00 290/7 |
| 2016/0123620 A1* | 5/2016 | Orsini .................. | G05B 19/048 700/276 |
| 2016/0284962 A1* | 9/2016 | Harding ............. | H05K 7/20745 |
| 2020/0274045 A1* | 8/2020 | Birmingham ........... | H01L 35/34 |

* cited by examiner

*Primary Examiner* — Suresh Suryawanshi
(74) *Attorney, Agent, or Firm* — Fenwick & West LLP

(57) ABSTRACT

This description provides a system for recovering energy released by a computing unit. The system comprises a first computing unit that generates heat energy as the first computing processes information, an energy recovery unit configured to recover the heat energy generated by the first computing unit, and a second computing unit coupled to the energy the energy recovery unit. The energy recovery unit further comprise a pump configured to transport a working fluid to absorb the heat energy generated by the first computing device and a conversion device configured to convert the absorbed heat energy into electrical energy. The electrical energy is passed to the second computing unit to supply power for the second computing unit to process information.

16 Claims, 5 Drawing Sheets

RECOVERING SMALL SCALE ENERGY IN ELECTRONIC SYSTEMS

CROSS REFERENCE TO RELATED APPLICATION

This application claims the benefit of U.S. Provisional Application No. 62/868,593 filed on Jun. 28, 2019, which is incorporated by reference in its entirety.

BACKGROUND

Field of Art

The disclosure relates generally to methods and systems for managing energy produced by electronic systems, and more specifically to converting heat energy produced by electronic systems into electric energy for powering additional electronic systems.

Description of the Related Art

Conventionally, heat generated by computer processors and other industrial electronics is removed from the devices by a fluid or a gas, which is then deposited into a system with the capacity to absorb the heat, for example an outside environment or a water supply. As a result, in such implementations, the heat is wasted.

Despite the waste of such heat energy being a recognized phenomenon, there is a scarcity of technologies that attempt to productively utilize the energy. Some existing air cooling systems recycle the removed heat energy to heat building spaces adjacent to the computers or electronics from which the heat energy was removed. However, these air cooling systems must overcome the relatively low volume of energy absorbed from individual devise and the medium that the energy is captured in or conveyed through. More specifically, these conventional air cooling systems require a large volume of air, which results in the density of the energy added to the air from the computers or electronics being very low. The low density of the absorbed energy makes reuse of the energy difficult. Other systems that implement liquid cooling often face similar energy density obstacles.

While some industrial waste heat recovery technologies are compatible with much higher energy densities and operate on much larger physical scales than individual electronic and computer installations, such industrial heat recovery technologies are not compatible with smaller scale electronic and computer installations. As a result, there exists a need for a system that combines technology for removing energy from computer processors in data centers and other industrial electronics with small-scale energy recovery technologies to productively recycle heat energy in small-scale computer and electronic installations.

SUMMARY

Computers and high-power electronics convert electrical energy into heat energy during the receipt, processing, and transmission of information of information. Because the receipt, processing, an transmission of information does not produce usable work, conventionally defined as a force exerted over a distance, the electrical energy consumed to perform these capabilities is converted into heat energy. The heat energy may be absorbed using a small-scale energy recovery system to productively use the converted heat energy. The heat energy may be used to generate electrical energy and/or mechanical energy, which may be used to power additional computers or high-power electronics. As a result, recovering and using the energy will increase overall efficiency and decrease operating costs of the machine, data center or electronics installation.

As described herein, a system for recovering heat energy released by a computing unit integrates techniques and technologies for cooling computers and electronics with small-scale energy recovery technologies to productive use generated heat energy to power computers, data centers, industrial electronics markets, or a combination thereof. In one embodiment, the system provides cools a computing unit, for example a computer processor or another high power, high heat electronic components, to absorb heat energy generated by the computing unit. Instead of wasting the generated heat energy, generated heat energy is converted into electrical or mechanical energy that powers other computing units, thereby increasing the overall efficiency of the operation of a group of devices, for example a rack of computers.

In one embodiment, the energy recovery system comprises a first computing unit that generates heat energy as it processes information, an energy recovery unit, and a second computing unit. The energy recovery unit further comprises a pump fluidically coupled to the first computing unit and a conversion device. The pump is configured to transport a cooling working fluid to the first computing unit to absorb the heat energy generated by the first computing unit. The pump then transports the cooling working fluid with the absorbed heat energy to the conversion device, which is configured to convert the heat energy absorbed by the cooling working fluid into electrical energy. The converted electrical energy is directed to the second computing unit, which is configured to use the converted electrical energy to power the operation of the second computing to process information.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

The figures depict various embodiments of the presented invention for purposes of illustration only. One skilled in the art will readily recognize from the following discussion that alternative embodiments of the structures and methods illustrated herein may be employed without departing from the principles described herein.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

I. System Configuration

Figure 1:
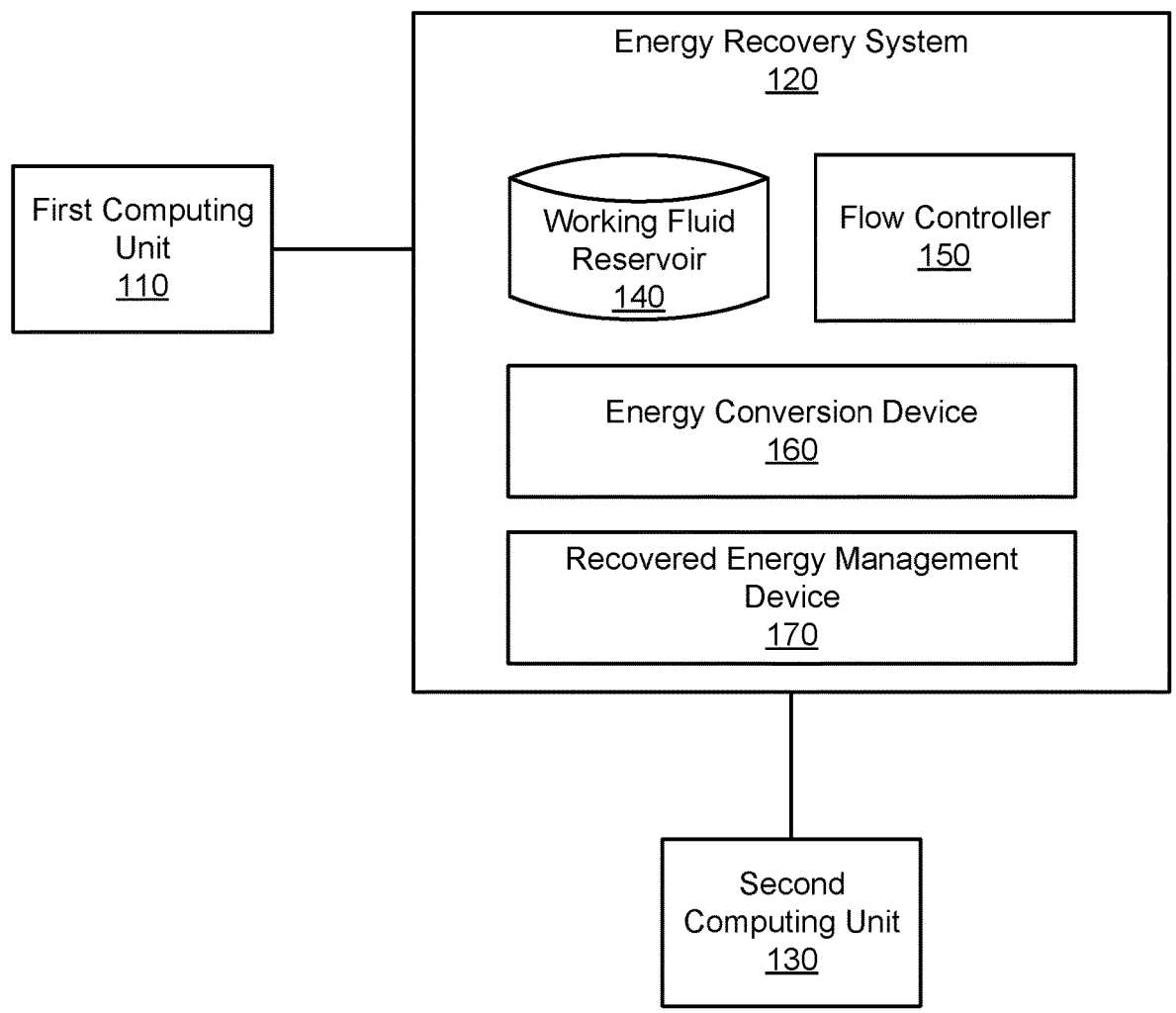
FIG. 1 illustrates a system environment for an energy recovery system, according to an example embodiment.

Turning now to Figure (FIG. 1, it illustrates a system environment for an energy recovery system 110, according to an example embodiment. In the embodiment illustrated in FIG. 1, the system environment comprises a first computing unit 110, an energy recovery system 120, and a second computing unit 130. In alternate embodiments, the system environment may comprise additional or fewer components.

The first computing unit 110 is a heat-generating device, capable of receiving, transmitting, and processing information and data. The first computing unit 110 receives electrical energy to enable data processing functions of the device. The operation of the first computing unit 110 to execute such data processing functions converts the supplied electrical energy into heat energy, which is emitted within and around the first computing unit 110. In one embodiment, the first computing unit is an individual processor or a processor among a rack of processors. In another embodiment, the first computing unit 110 is a conventional computer system, such as a desktop or a laptop computer. Alternatively, the first computing 110 may be a device having computer functionality, such as a personal digital assistant (PDA), a mobile telephone, a smartphone, or another suitable device.

For simplicity, only a single heat-generating computing unit 110 (e.g., first computing unit 110) is illustrated in FIG. 1, one skilled in the art would appreciate that the system could also be applied to multiple heat-generating computing units operating simultaneously.

The first computing unit 110 is fluidically coupled to the energy recovery system 120. As described herein, "fluidically coupling" of two components enables the flow of fluid between the two components. Accordingly, working fluid flows between the energy recovery system 120 and the first computing unit 110. The working fluid, stored in the working fluid reservoir 140, is a cooling working fluid capable of absorbing heat generated by the first computing unit 110. When transported from the working fluid reservoir 140 to the first computing unit, the cooling working fluid cools the first computing unit 110 by absorbing the heat energy emitted by the unit 110. As the working fluid flows from the first computing unit to the energy recovery system 120, the working fluid transports the absorbed heat energy from the first computing unit 110 to the energy recovery system 120, and more specifically to the energy conversion device 160. In some embodiments, the cooling working fluid is a refrigerant. Examples of cooling working fluids include, but are not limited to, a fluorinated ketone or fluorocarbon-based fluids.

In one embodiment, the heat energy is absorbed into the working flood by direct conduction of the heat energy from the processor or computing unit into the working fluid. In alternate embodiments, the heat energy is absorbed into the working fluid by convection from the processor or computing unit to a controlled airflow and then into the working fluid by convection.

The first computing unit 110 and the energy recovery system 120 may be fluidically coupled using a direct liquid-on-chip system, wherein the heat energy is conducted directly through the liquid. In such implementations, the first computing unit 110, for example a processor on a server rack, may be cooled by transporting the working fluid from the reservoir 140 directly through the processing chip of the first computing unit 110. The working fluid may be transported from the energy recovery system 120 to the cool the first computing unit 110 using a first set of pipelines that couple the processor of the first computing unit 110 and the working fluid reservoir 140. A second set of pipelines may enable the transportation of the working fluid from the first computing 110 back to the energy recovery system 120 and, more specifically, to the energy conversion device 160. The first set of pipelines and the second set of pipelines may be mounted using a single pipe manifold. In alternate embodiment, the first set of pipelines and the second set of pipelines may be integrated into separate pipe manifolds.

Although not shown in FIG. 1, the system environment of the energy recovery system 120 may comprise multiple heat-generating computing units 110 in simultaneous operation, for example a server rack system. In such implementations, the first set of pipelines may include pipelines with a valve system that enables working fluid from the energy recovery system 120 to each of the heat-generating computing units in a sequential order. For example, in a pipe manifold with sets of pipelines for supplying working fluid to two computing units 110, a first valve may be opened allowing the working fluid to flow through the processor of the first computing unit before a second value is opened to allow the working fluid to flow through the processor of the second computing unit.

Alternatively, the first set of pipelines may transport working fluid from the energy recovery system 120 to each of the heat-generating computing units in parallel. Returning to the previous example with two heat-generating computing units, the first valve and the second valve may be opened at the same time to allow the processor of the first working unit and the processor the second working unit to be cooled simultaneously.

In some implementations, only a subset of computing units 110 may be currently generating heat. In such implementations, the energy recovery system 120 comprises a controller, for example the flow controller 150, configured to identify which computing units are actively generating heat and open specific valves within the set of pipelines to enable the flow of working fluid through only the heat-generating computing units. Consistent with the above description of the first set of pipelines, the second set of pipelines also be configured to transport heat-absorbed working fluid back from each heat-generating unit 110 back to the energy recovery system 120.

An example system of pipelines involving multiple heat-generating computing units is illustrated and further described with reference to FIG. 4.

In typical heat-generating computing units, for example the first computing unit 110, approximately 85% of the total heat energy is generated by the processor of the computing unit. Accordingly, the liquid-on-chip system described above only absorbs 85% of the heat energy generated by the computing unit. In some embodiments, the first working unit 110 and the energy recovery system 120 may additionally be coupled to enable the transportation of a cooling gas from a storage unit in the energy recovery system (not shown). Similar to how the working fluid described above absorbs heat energy via a liquid-on-chip system, the cooling gas is circulated through the first computing unit by a system that is separate, both physically and in design, from the system circulating the working fluid. The circulation of the cooling gas through the computing unit absorbs the fraction of heat energy that was not absorbed by the working fluid and transports the absorbed fraction of heat energy to the energy conversion device 160. Examples of cooling gases included, but are not limited to, nitrogen, helium, or a gaseous form of fluorinated ketones or fluorocarbon-based fluids.

In addition or in place of the working fluid, the energy recovery system 120 may be designed to transport a cooling gas to the first computing unit 110 to absorb the heat energy generated by the processor of the first computing unit 110.

When the heat-absorbed working fluid returns to the energy recovery system 120 from the first computing unit 110, the energy recovery system 120 separates the heat energy from the heat-absorbed working fluid. The energy recovery system 120 converts the separated heat energy into mechanical energy, electrical energy, or a combination thereof. The converted mechanical or electrical energy is communicated to a second computing unit 130, which is electronically and/or mechanically coupled to the energy recovery system 120. As described herein, an electric coupling between the second computing unit 130 and the energy recovery system 120 enables the transmission of electrical energy between the two components. As described herein, a mechanical coupling between the second computing unit 120 and the energy recovery system 120 enable the transmission of mechanical energy between the two components.

The second computing unit 130 is a device that is functionally and descriptively consistent with the first computing unit 110, as described above. The second computing unit 130 may additionally execute data processing procedures, for example information transmission and processing, using electrical and mechanical energy. Accordingly, the electrical and/or mechanical coupling of the second computing unit 130 to the energy recovery unit 120 enables the transmission of electrical and mechanical energy that can initiate and sustain the processing capabilities of the second computing unit 130. In some embodiments, the energy converted by the energy recovery system 120 represents only a fraction of the energy needed to sustain the operation of the second computing unit. The remaining energy may be supplied from other electrical or mechanical energy sources.

In alternate embodiments, the converted electrical energy is supplied as supplemental power to multiple adjacent computing units. The converted electrical energy may also be supplied to provide power for adjacent electrically-powered devices including, but not limited to, rack lighting or display screens. Alternatively, the converted electrical energy may also be used to charge or maintain the charge in emergency backup batteries for computing or house loads. In yet another embodiment, the converted electrical energy may be supplied to supplement power to a pumping mechanism of the energy recovery system.

Turning now to the illustrated architecture of the energy recovery system 120, the energy recovery system 120 pumps working fluid and, in applicable embodiments cooling gas, to the first computing unit 110 to absorb heat energy generated by the computing unit 110 and returns the heat-absorbed working fluid from the computing unit 110 back to the energy recovery system 120. The energy recovery system 120 comprises a working fluid reservoir 140, a flow controller 150, an energy conversion device 160, and a recovered energy management device 170. In alternate embodiments, the system environment may comprise additional or fewer components. Although not shown in FIG. 1, the energy recovery system 120 may additionally include a reservoir for storing a cooling gas.

As described above the working fluid reservoir 140 stores a cooling working fluid that cools the first computing device 110 by absorbing heat energy generated by the processor of the unit 110. Fluidic coupling of the energy recovery system 120 and the first computing unit 110 enables the transportation of the working fluid from the working fluid reservoir 140 to the processor of the first computing unit 110 and from the processor of the first computing unit 110 to the energy recovery device 160.

The flow controller 150 is a programmable electric unit that direct the flow of working fluid between components of the energy recovery system 120 (e.g., the fluid reservoir 140 and the energy recovery device 160) and components of the first computing unit 110 (e.g., the processor). In embodiments that transport working fluid to multiple heat-generating computing units via sets of pipelines, the flow controller 150 may operate valves in the set of pipelines mounted by a pipe manifold to control the flow of the working fluid to each of the heat-generating computing units. For example, the flow controller 150 may control the operation of the valves to cool the heat-generating computing units in series or in parallel. The flow controller 150 may also control the timing with which valves to each heat-generating computing unit are opened or closed to control the timing with which each computing unit is cooled.

The flow controller 150 may further comprise a pump (not shown) that induces the flow of working fluid between the energy recovery system 120 and the first computing unit 110. The pump of the flow controller 150 also induces the circulation of working fluid through a liquid-on-chip system of the processor, such that the working fluid absorbs heat energy generated by the processor. The flow controller 150 may additionally monitor the performance of the pump based on one or more flow metrics including, but not limited to, pressure measurements, temperature measurements, phase readings, and flow speed measurements. The flow controller 150 may additionally operate other control devices in the energy recovery system 120.

The energy conversion device 160 converts the heat energy absorbed from the first computing unit 110 by the working fluid into electrical energy, mechanical energy, or both. The energy conversion device 160 collects heat-absorbed working fluid that has been passed through processors of one or a plurality of heat-generating computing units (e.g., dozens or hundreds of units). In one embodiment, the energy conversion device 160 separates heat energy from a heat-absorbed working fluid by applying pressure to the heat-absorbed working fluid. In some embodiments, pressure is applied within the range 11 and +1 ATM to maximize the amount of separated heat energy. In an alternate embodiment, the energy conversion device 160 separates the heat energy by reducing the temperature of the working fluid or facilitating a phase change of the working fluid. In some embodiments, the temperature for separating the heat energy is approximately 60° C., but does not exceed a maximum operating temperature of the computing device. Alternatively, the energy conversion device 160 may facilitate a phase change of the working fluid by providing sufficient surface area and thermal resistance for the working fluid to condense during the separation of the heat energy.

Once separated, the energy conversion device converts the separated heat energy into mechanical energy. In one embodiment, the separated heat energy is converted into mechanical energy using one or more thermal cycle-based engine, for example Sterling engines or microturbines. The mechanical energy may be further applied to generate electrical energy. In one example embodiment, the mechanical energy may be a torque that is applied to a rotating shaft of a generator. The applied torque causes the shaft to rotate, resulting in the generation of electrical energy by the generator. In alternate embodiments, the shaft may be rotated by a turbine or another reciprocating mechanism that is driven by the change in the working fluid pressure, temperature, or both during the separation of the absorbed heat energy and the working fluid.

In another embodiment, the mechanical energy may be applied to a pump (at the energy recovery system) that controls the flow of a second working fluid that is more suitable to transport the heat energy. Such a second working fluid is referred to as a power generation working fluid. Compared to cooling working fluid, power generation working fluid is more suitable to facilitate the conversion of heat energy into mechanical energy by the thermal cycle-based engines described above. Examples of power generation working fluid include, but are not limited to, nitrogen, helium, and dry air.

The energy conversion device 160 may additionally comprise a heat exchanger that transfers the heat energy separated from the first cooling working fluid to a power generation working fluid After the transfer of heat energy to the power generation working fluid, the pump may control the flow of the power generation working fluid to turn a shaft on a generator to produce electrical energy.

After the energy conversion device 160 has separated the heat energy absorbed by the cooling working fluid, the flow controller 150 may pump the separated cooling fluid back to the working fluid reservoir 160. In alternate embodiments in which the first computing unit 110 has continued to process data and generate heat energy, the flow controller 150 pumps the separated cooling fluid directly back to the first computing unit to continue absorbing heat energy generated by the first computing unit 110.

Once the energy conversion device 160 has converted the heat energy absorbed by the working fluid into a type of power-generating energy (e.g., electrical or mechanical energy), the recovered energy management device 170 determines whether the converted energy should be recycled to power the second computing device 10 or be dispersed into the surrounding environment. In one embodiment, if the amount of converted energy exceeds a threshold amount, the recovered energy management device 170 directs the converted energy to the second computing unit to power to the second computing unit. However, if the amount of converted energy is below a threshold amount, the recovered energy management device 170 releases the converted energy into an environment surrounding the energy recovery system 120. In alternate embodiments, the recovered energy management device 170 may compare the amount of converted energy to a maximum threshold, such that the device 170 is able to determine and release excess amounts of energy. The converted electrical energy is applied directly to the circuit supplying power to the second computing unit, which, in some embodiments, reduces the total electrical load applied to the second computing unit.

The recovered energy management device 170 additionally includes a condenser (not shown) to cool and release the absorbed heat energy into a surrounding environment. For example, after cooling the heat energy via a condenser, the recovered energy management device 170 may release the converted energy into air surrounding the energy recovery system 120 or into a supply of water adjacent to the energy recovery system. Alternatively, the supply of water may be coupled to the energy recovery system such that the converted energy may be transported directly into the supply of water. In alternate embodiments, an alternate fluid may be used in place of water.

In embodiments in which the energy recovery device 160 converts some or all of the heat energy captured from liquid-on-chip system and recycles the energy converted from heat energy, the recovered energy management device 170 may direct the converted energy to power or supplement power to other electronic equipment associated with the first computing device 110, for example the second computing device 130. Alternatively, the converted energy may be directed to a secondary energy recovery system to recover any remaining heat energy generated by the first computing unit. As a result, the recycling of energy converted by the energy recovery device 160 results in an overall improvement in efficiency for a computing unit involving at least the first computing device 110 and the second computing device 120.

Figure 2:
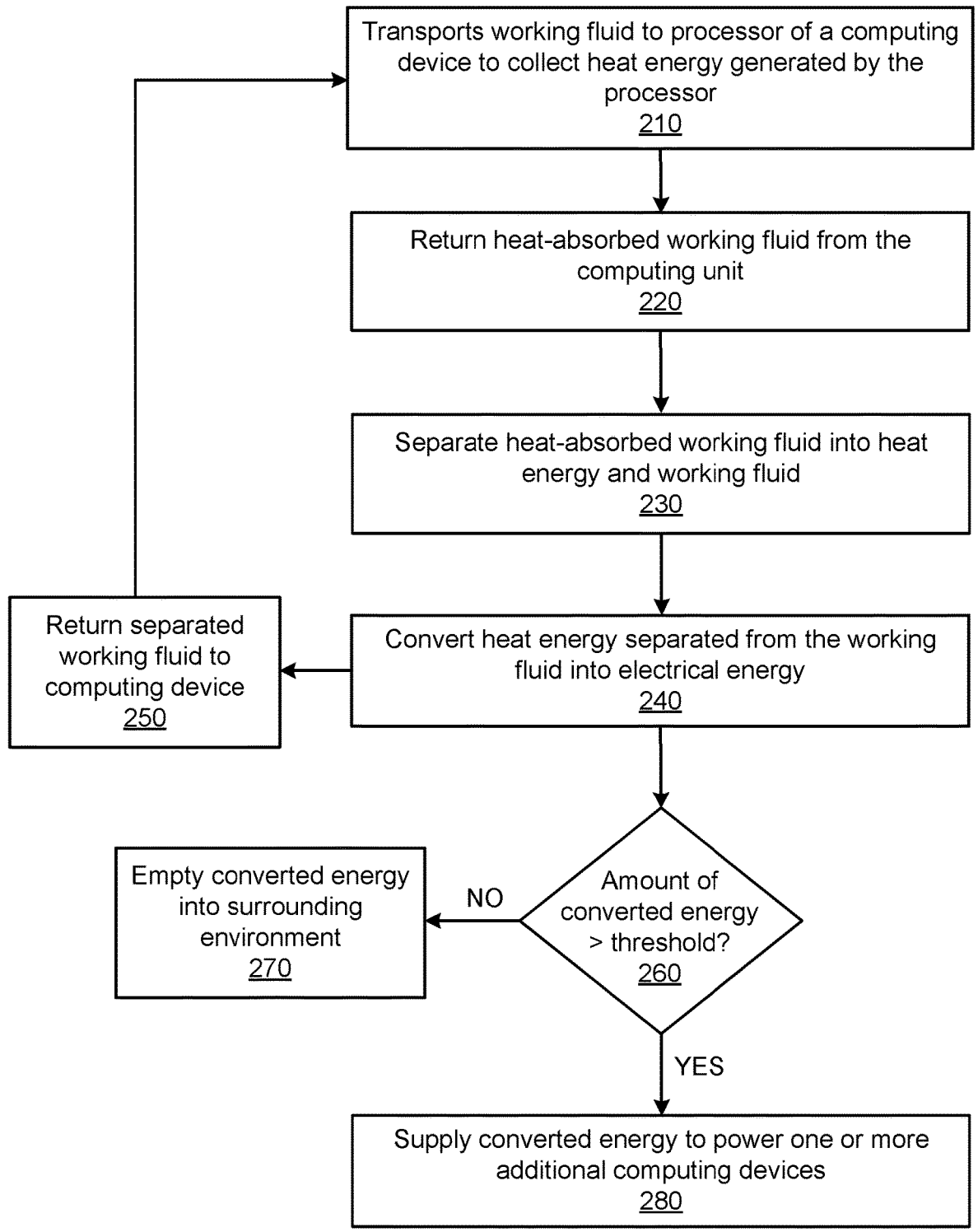
FIG. 2 is a flow chart of a process for recycling absorbed heat energy from a first computing unit to power a second computing unit, according to an example embodiment.

FIG. 2 is a flow chart of a process for recycling absorbed heat energy from a first computing unit to power a second computing unit, according to an example embodiment. An energy recovery system, for example the energy recovery system 120, transports 210 working fluid to a processor of a computing unit, for example the first computing unit 110. As described above, the operation and of the computing unit converts electrical energy into heat energy, which is emitted by various electrical components of the first computing unit. For example, the processor of the computing unit generates 85% of the total heat energy, while other electrical components generate the remaining 15% of heat energy. The working fluid, often referred to as a "cooling working fluid," is a coolant fluid, for example a refrigerant. In one embodiment, the working fluid flows through a liquid-on-chip system through the processor of the computing unit to absorb the heat energy generated by the processor.

The energy recovery system returns 220 the heat-absorbed working fluid to the energy recovery system and separates 230 the heat energy from the working fluid. The energy recovery system may apply a pressure change, a temperature change, a phase change, or a combination thereof to the heat-absorbed working fluid to separate the heat energy. In addition to the separation techniques described above, any other suitable method may be used to separating the heat energy from the heat-absorbed working fluid.

The energy recovery system converts 240 the heat energy separated from the working fluid into electrical energy, which may be used to supply power to an additional computing device. The separated heat energy may first be converted into mechanical energy. The converted mechanical energy is a force or a torque that is applied to operate an electrical generator. In one embodiment, the mechanical energy is a torque that is applied to turn a rotating shaft of a generator. The turning of the rotating shaft causes the generator to generate electrical energy, thereby converting the mechanical energy into electrical energy.

After separating the heat-absorbed working fluid into heat energy and the initial working fluid (e.g., the cooling working fluid), the energy recovery system returns 250 the working fluid to the computing unit. In embodiments in which the computing unit has continued to generate heat, the returned working fluid is transported 210 to the processor of the computing device to absorbing heat energy generated by the processor. In such embodiments, the steps 210, 220, 230, 240, and 250 are repeated. In alternate embodiments in which computing unit has not continued to generate heat, the separated working fluid may be returned to and stored by the energy recovery system until a computing unit begins to generate heat.

The energy recovery system evaluates the electrical energy converted from the heat energy to determine 260 whether the amount of converted energy exceeds a threshold amount. The threshold amount may represent a minimum amount of energy that can be productively recycled to supply power to another computing unit. Accordingly, if the amount of converted electrical energy is below the threshold amount, the energy recovery system empties 270 the converted electrical energy into the surrounding environment. If the amount of converted electrical energy is greater than the threshold amount, the energy recovery system supplies 280 the converted energy to provide power to operate an additional computing unit, for example the second computing unit 120. The supplied electrical energy may represent all of the energy needed to operate the additional computing unit or a fraction of needed energy.

The energy recovery system may apply a threshold amount representing a maximum amount of usable energy in addition or instead of the minimum threshold amount described above. Based on a comparison of the amount of converted energy to the maximum threshold amount, the energy recovery system determines whether a surplus of electrical energy has been converted from the absorbed heat energy. The energy recovery system may redirect the surplus electrical energy to supply power to yet another computing unit (e.g., a third computing unit separate from the first computing unit 110 and the second computing unit 130), or may be emptied 270 in the surrounding environment. For example, the energy recovery system may compare the surplus electrical energy to the minimum threshold amount described above. If the surplus energy is greater than the minimum threshold amount, the surplus may be redirected to supply 280 power to the third computing device. If the surplus energy is below the minimum threshold amount, the surplus energy may be emptied 270 into the surrounding environment.

Figure 3:
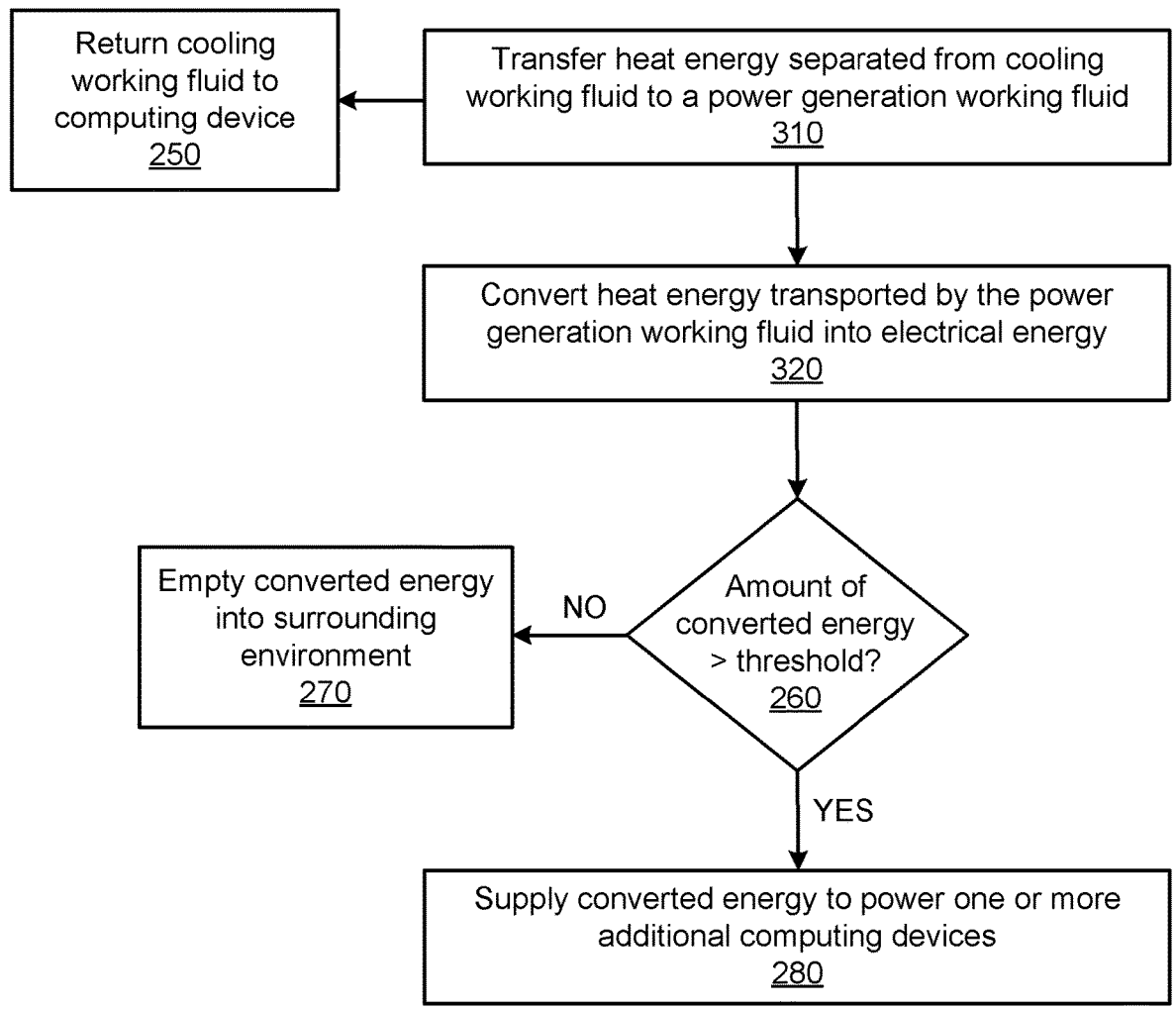
FIG. 3 is a flowchart of a process for implementing a power generation working fluid to supply converted energy to an additional computing device, according to an example embodiment.

FIG. 3 is a flowchart of a process for implementing a power generation working fluid to supply converted energy to an additional computing device, according to an example embodiment. As described above, the cooling working fluid passed through the liquid-on-chip system of the processor may not be the most suitable working fluid for transporting heat energy. The energy recovery system may transfer 310 the heat energy separated from the cooling working fluid to a power generation working fluid. In one embodiment, the energy recovery system transfers heat energy to the power generation working fluid using a heat exchanger. Following the transfer, the heat-depleted cooling working fluid is returned 250 to the computing device 320 as described with reference to FIG. 2. Consistent with the method described in FIG. 2, energy recovery system converts 320 the heat energy transported by the power generation working fluid into the electrical energy. The energy recovery system evaluates the electrical energy converted from the heat energy to determine 260 whether the amount of converted energy exceeds a threshold amount. The threshold amount may represent a minimum amount of energy that can be productively recycled to supply power to another computing unit. Accordingly, if the amount of converted electrical energy is below the threshold amount, the energy recovery system empties 270 the converted electrical energy into the surrounding environment. If the amount of converted electrical energy is greater than the threshold amount, the energy recovery system supplies 280 the converted energy to provide power to operate an additional computing unit, for example the second computing unit 120.

Figure 4:
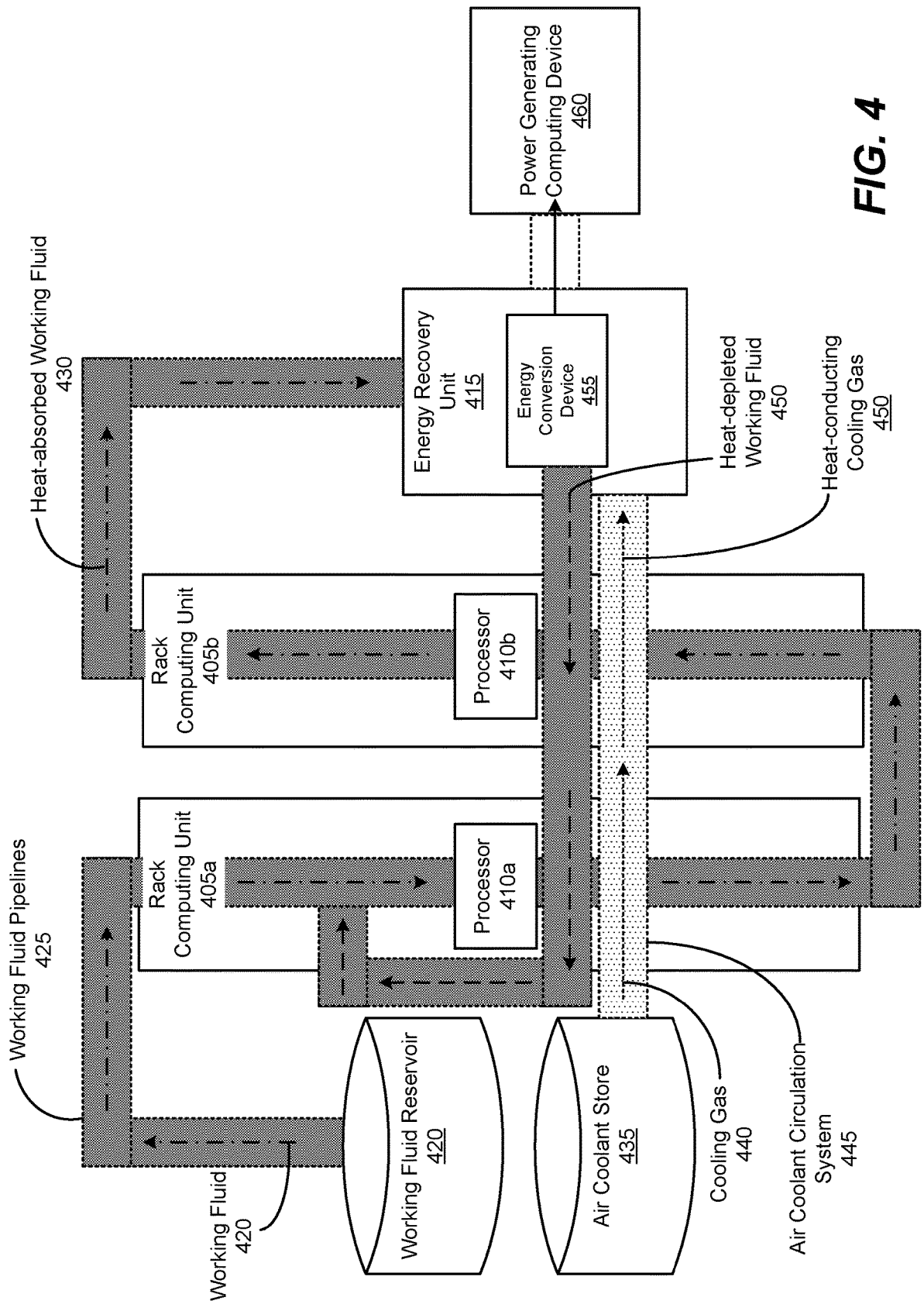
FIG. 4 is an illustration of a physical energy environment of a recovery system implemented for multiple racks of computer processors, according to an example embodiment.

FIG. 4 is an illustration of a physical energy environment of a recovery system implemented for multiple racks of computer processors, according to an example embodiment. The system environment illustrated in FIG. 4 includes two heat-generating rack computing units 405a and 405b and an energy recovery unit 415. Each of the rack computing units 405a and 405b include a processor, 410a and 410b, respectively. A cooling working fluid (e.g., working fluid 420) is stored in a working fluid reservoir 420 and a cooling gas (e.g. cooling gas 440) is stored in an air coolant store 435. For the sake of illustration, the reservoir 415 and the store 435 are illustrated in FIG. 4 as components that are external to the energy recovery unit 415. However, in the most common implementations of the energy recovery unit 415, the reservoir 420 and the store 435 are integrated into the design of the energy recovery unit 415.

Working fluid 425 flows from the working fluid reservoir 415 through a system of working fluid pipelines 430. The working fluid pipelines 430 couple the racking computing units 405a and 405b and the working fluid reservoir 420 such that the working fluid 420 flows through the processors 410a and 410b. The path of the flow of working fluid 420 is illustrated by the directional arrows in FIG. 4. In the illustrated embodiment, the working fluid 420 flows through the processor 410a and 410b sequentially. In other embodiments, each rack computing unit 405 may be coupled to a different system of working fluid pipelines that fluidically couple the working fluid reservoir 420, the processor 410, and the energy recovery unit 415. Alternatively, the rack computing units 405a and 405b may be coupled to a single system of working fluid pipelines such that working fluid 420 flows through each the processors 410a and 410b in parallel.

The working fluid 420 flows from the working fluid reservoir 420 to the processor 410a and then to the processor 410b. Because both of the racking computing units 405a and 405b are actively processing data, the respective processors 410a and 410b generate heat. The working fluid 420 flowing through the processors 410a and 410b absorbs the generated heat. The heat-absorbed working fluid 430 flows into the energy recovery unit 415.

Cooling gas 440 flows from the air coolant store 430 through the air coolant circulation system 445. For each rack computing unit 405, the processor 410 accounts for a large fraction of the generated heat. However, other electrical components throughout the rack computing unit also generate heat as the rack computing unit 405a processes information. As a result, the working fluid flowing through the processor 410 may not capture all the heat generated by the rack computing unit. The air coolant circulation system 445 circulates the cooling gas 440 through the non-processor heat-generating electric components, such that the cooling gas conducts the generated heat towards the energy recovery unit 415.

At the energy recovery unit 415, the heat-absorbed working fluid 430 and the heat-conducting cooling gas 450 are processed by the energy conversion device 455 to separate the heat energy from the cooling gas and the working fluid. After separating the heat energy from the heat-absorbed working fluid 430, the now heat-depleted working fluid 450 is returned to the working fluid reservoir 420. Alternatively, the heat-depleted working fluid 450 is directly recirculated through the processors 410a and 410b via the working fluid pipelines 425. Although not shown, the heat-depleted cooling gas may similarly be returned to the air coolant store 435 or directly recirculated through the rack computing units 410a and 410b by the air coolant circulation system 445

The energy conversion device 455 converts the separated heat energy into electrical energy. The energy conversion device 455 is an embodiment of the energy conversion device 160. The converted electrical energy is directed to supply power to a power generating computing device 460. In some embodiments, the electrical energy is supplied to more than one power generating computing devices 460. For example, the energy recovery unit 415 may evaluate the amount of electrical energy converted from the heat energy absorbed by the cooling gas and the working fluid and, based on the amount of energy, siphon fractions of the electrical energy to each power generating computing device 460. The fractions of siphoned electrical energy may be determined by the energy recovery unit 415 based on the power supply specifications of each power generating computing device 460.

Computing Machine Architecture

Figure 5:
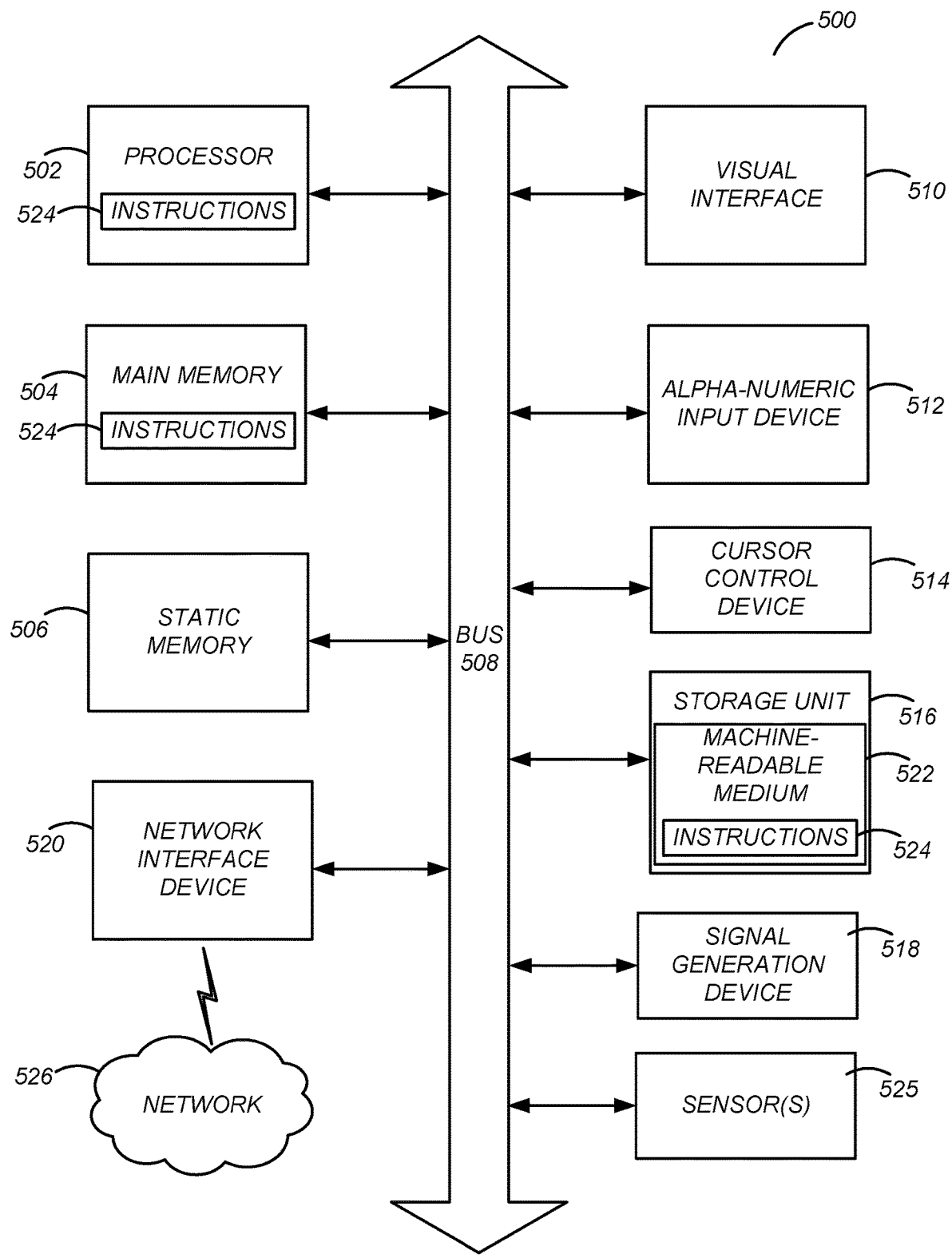
FIG. 5 is a block diagram illustrating components of an example machine able to read instructions from a machine-readable medium and execute them in a processor (or controller), according to an example embodiment.

FIG. 5 is a block diagram illustrating components of an example machine able to read instructions from a machine-readable medium and execute them in a processor (or controller), according to one embodiment. Specifically, FIG. 5 shows a diagrammatic representation of a machine in the example form of a computer system 500 within which program code (e.g., software) for causing the machine to perform any one or more of the methodologies discussed herein may be executed. The program code may be comprised of instructions 524 executable by one or more processors 502. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, an internet of things (IoT) device, a switch or bridge, or any machine capable of executing instructions 524 (sequential or otherwise) that specify actions to be taken by that machine. Further, while only a single machine is illustrated, the term "machine" shall also be taken to include any collection of machines that individually or jointly execute instructions 524 to perform any one or more of the methodologies discussed herein.

The example computer system 500 includes one or more processors 502 (e.g., a central processing unit (CPU), one or more graphics processing units (GPU), one or more digital signal processors (DSP), one or more application specific integrated circuits (ASICs), one or more radio-frequency integrated circuits (RFICs), or any combination of these), a main memory 504, and a static memory 506, which are configured to communicate with each other via a bus 508. The computer system 500 may further include visual display interface 510. The visual interface may include a software driver that enables displaying user interfaces on a screen (or display). The visual interface may display user interfaces directly (e.g., on the screen) or indirectly on a surface, window, or the like (e.g., via a visual projection unit). For ease of discussion the visual interface may be described as a screen. The visual interface 510 may include or may interface with a touch enabled screen. The computer system 500 may also include alphanumeric input device 512 (e.g., a keyboard or touch screen keyboard), a cursor control device 1014 (e.g., a mouse, a trackball, a joystick, a motion sensor, or other pointing instrument), a storage unit 516, a signal generation device 518 (e.g., a speaker), and a network interface device 520, which also are configured to communicate via the bus 508.

The storage unit 516 includes a machine-readable medium 522 on which is stored instructions 524 (e.g., software) embodying any one or more of the methodologies or functions described herein. The instructions 524 (e.g., software) may also reside, completely or at least partially, within the main memory 504 or within the processor 502 (e.g., within a processor's cache memory) during execution thereof by the computer system 500, the main memory 504 and the processor 502 also constituting machine-readable media. The instructions 524 (e.g., software) may be transmitted or received over a network 526 via the network interface device 520.

While machine-readable medium 522 is shown in an example embodiment to be a single medium, the term "machine-readable medium" should be taken to include a single medium or multiple media (e.g., a centralized or distributed database, or associated caches and servers) able to store instructions (e.g., instructions 524). The term "machine-readable medium" shall also be taken to include any medium that is capable of storing instructions (e.g., instructions 524) for execution by the machine and that cause the machine to perform any one or more of the methodologies disclosed herein. The term "machine-readable medium" includes, but not be limited to, data repositories in the form of solid-state memories, optical media, and magnetic media.

The computer system 500 also may include the one or more sensors 525. Also note that a computing device may include only a subset of the components illustrated and described with FIG. 5. For example, an IoT device may only include a processor 502, a small storage unit 516, a main memory 504, a visual interface 510, a network interface device 520, and a sensor 525.

VI. Additional Considerations

It is to be understood that the figures and descriptions of the present disclosure have been simplified to illustrate elements that are relevant for a clear understanding of the present disclosure, while eliminating, for the purpose of clarity, many other elements found in a typical system. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Some portions of above description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as engines, without loss of generality. The described operations and their associated engines may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

While particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A system for recovering energy released by a computing unit, the system comprising:
   a first computing unit of a plurality of computing units, the first computing unit generating heat energy as the first computing unit processes information;
   an energy recovery unit comprising:
      a pump fluidically coupled to the first computing unit, the pump configured to transport a cooling working fluid through the first computing unit to absorb the heat energy generated by the first computing device; and
      a conversion device configured to:
         separate the absorbed heat energy from the cooling working fluid;
         return the separated cooling working fluid to the first computing unit; and
         convert the separated heat energy into electrical energy; and
   a second computing unit coupled to the energy recovery unit, the second computing unit configured to use the electrical energy converted by the conversion device to power the second computing unit to process information.

2. The system of claim 1, wherein the cooling working fluid is one of the following:
   a refrigerant that conducts heat energy away from the first computing device; or
   a refrigerant configured to absorb heat energy through a controlled airflow.

3. The system of claim 1, wherein the conversion device is further configured to:
   convert the separated heat energy into mechanical energy; and
   generate electrical energy using the mechanical energy.

4. The system of claim 1, wherein the conversion device further comprises a heat exchanger configured to transfer the separated heat energy from the cooling working fluid into a power generation working fluid.

5. The system of claim 1, further comprising:
   a condenser configured to cool and release the separated heat energy into a surrounding environment.

6. The system of claim 1, wherein the pump is further configured to:
   return the cooling working fluid to the first computing unit in response to the conversion of the separated heat energy into electrical energy by the conversion device.

7. The system of claim 1, wherein the pump further comprises:
   a controller configured to:
      direct flow of the cooling working fluid between the first computing device and the energy recovery unit; and
      monitor performance of the pump.

8. The system of claim 1, further configured to:
   circulate a cooling gas through the first computing unit to absorb a fraction of the heat energy generated by the first computing unit, wherein the cooling gas provides the absorbed heat energy to the conversion device.

9. A method for recovering energy released by a computing unit, the method comprising:
   transporting, by a pump of an energy recovery unit, a cooling working fluid through a first computing unit generating heat during the processing of information, wherein the cooling working fluid absorbs the heat energy generated by the first computing unit;
   transporting, by the pump, the cooling working fluid and the absorbed heat energy to a conversion device of the energy recovery unit;
   separating, by the conversion device of the energy recovery unit, the absorbed heat energy from the cooling working fluid; and
   returning, by the pump, the separated cooling working fluid to the first computing unit; and
   converting, by the conversion device of the energy recovery unit, the separated heat energy into electrical energy; and
   transporting the electrical energy converted by the conversion device to a second computing unit, wherein the transported electrical energy powers the second computing unit to process information.

10. The method of claim 9, wherein the cooling working fluid is one of the following:

a refrigerant that conducts heat energy away from the first computing device; or a refrigerant configured to absorb heat energy through a controlled airflow.

11. The method of claim 9, wherein converting the heat energy absorbed by the working fluid into electrical energy comprises:

converting the separated heat energy into mechanical energy; and generate electrical energy using the mechanical energy.

12. The method of claim 9, wherein converting the heat energy absorbed by the working fluid into electrical energy comprises:

transferring, by a heat exchanger, the separated heat energy from the cooling working fluid into a power generation working fluid.

13. The method of claim 9, further comprising:

cooling, by a condenser, the heat energy separated from the cooling working fluid; and releasing the separated heat energy into a surrounding environment.

14. The method of claim 9, further comprising:

responsive to converting the separated heat energy absorbed by the working fluid into electrical energy, return the cooling working fluid to the first computing unit using the pump of the energy recovery unit.

15. The method of claim 9, wherein the energy recovery unit further comprises a controller configured to:

direct flow of the cooling working fluid between the first computing device and the energy recovery unit; and monitor performance of the pump.

16. The method of claim 9, further comprising:

circulating a cooling gas through the first computing unit to absorb a fraction of the heat energy generated by the first computing unit, wherein the cooling gas provides the absorbed heat energy to the conversion device.

* * * * *

UNITED STATES PATENT AND TRADEMARK OFFICE
CERTIFICATE OF CORRECTION

| | | |
|---|---|---|
| PATENT NO. | : 11,496,073 B2 | |
| APPLICATION NO. | : 16/913543 | |
| DATED | : November 8, 2022 | |
| INVENTOR(S) | : Nathan Larson | |

It is certified that error appears in the above-identified patent and that said Letters Patent is hereby corrected as shown below:

On the Title Page

Item (57), in Column 2, under "Abstract", Line 7, delete "energy the energy" and insert -- energy --, therefor.

Signed and Sealed this
Fourth Day of April, 2023

Katherine Kelly Vidal
*Director of the United States Patent and Trademark Office*